United States Patent
Zhu et al.

(10) Patent No.: US 11,877,423 B2
(45) Date of Patent: Jan. 16, 2024

(54) BATTERY THERMAL MANAGEMENT WITH LARGE AREA PLANAR HEAT PIPES

(71) Applicant: Toyota Motor Engineering and Manufacturing North America, Inc., Plano, TX (US)

(72) Inventors: Gaohua Zhu, Ann Arbor, MI (US); Tenghua Tom Shieh, Ann Arbor, MI (US); Evan B. Fleming, Ann Arbor, MI (US); Swetha Minupuri, Farmington Hills, MI (US); Debasish Banerjee, Ann Arbor, MI (US); Ryuta Sugiura, Ann Arbor, MI (US); Yusuke Suzuki, Nagakute (JP); Takayoshi Tanaka, Shimizu-ku (JP); Satoko Tofukuji, Tokyo (JP)

(73) Assignees: Toyota Motor Engineering and Manufacturing North America, Inc., Plano, TX (US); Toyota Jidosha Kabushiki Kaisha, Aichi-ken (JP)

( * ) Notice: Subject to any disclaimer, the term of this patent is extended or adjusted under 35 U.S.C. 154(b) by 372 days.

(21) Appl. No.: 17/065,782

(22) Filed: Oct. 8, 2020

(65) Prior Publication Data

US 2022/0117116 A1  Apr. 14, 2022

(51) Int. Cl.
*H05K 7/20* (2006.01)
*H01M 10/613* (2014.01)
(Continued)

(52) U.S. Cl.
CPC ...... *H05K 7/20281* (2013.01); *H01M 10/613* (2015.04); *H01M 10/617* (2015.04);
(Continued)

(58) Field of Classification Search
CPC ......... H01M 10/6556; H01M 2220/20; H01M 10/617; H01M 10/6552; H01M 50/204;
(Continued)

(56) References Cited

U.S. PATENT DOCUMENTS

| 4,046,190 A | 9/1977 | Marcus et al. |
| 8,703,319 B1 * | 4/2014 | Aston ................. H01M 50/244 429/120 |

(Continued)

FOREIGN PATENT DOCUMENTS

| CN | 201773919 U | * | 3/2011 | ............. Y02E 60/10 |
| CN | 102318104 A | * | 1/2012 | .......... H01M 10/613 |

(Continued)

OTHER PUBLICATIONS

Adami et al., "Development and Evaluation of a Planar Heat Pipe for Cooling Electronic Systems" Chemical Engineering Communications, vol. 90, 1990—Issue 1, abstract, 1 page.

(Continued)

*Primary Examiner* — Kaity V Chandler
(74) *Attorney, Agent, or Firm* — Jordan IP Law LLC

(57) ABSTRACT

A thermal management system to cool one or more battery packs of a battery system may include a heat pipe arrangement that includes a plurality of heat pipes, having a planar configuration, in thermal contact with the one or more battery packs to draw heat therefrom, and a heat sink arrangement that includes a plurality of heat sinks, in thermal contact with two or more edges of the heat pipe arrangement, to dissipate heat away from the heat pipe arrangement.

20 Claims, 5 Drawing Sheets

(51) Int. Cl.
*H01M 10/6556* (2014.01)
*H01M 10/6552* (2014.01)
*H01M 10/617* (2014.01)

(52) U.S. Cl.
CPC ... *H01M 10/6552* (2015.04); *H01M 10/6556* (2015.04); *H05K 7/2039* (2013.01); *H05K 7/20254* (2013.01); *H01M 2220/20* (2013.01)

(58) Field of Classification Search
CPC ... H05K 7/20254; H05K 7/2039; Y02E 60/10
See application file for complete search history.

(56) References Cited

U.S. PATENT DOCUMENTS

| | | | |
|---|---|---|---|
| 9,551,538 B2 | 1/2017 | Honmura et al. | |
| 9,689,624 B2 | 6/2017 | Timmons et al. | |
| 10,544,994 B2 | 1/2020 | Wakaoka et al. | |
| 2007/0068657 A1 | 3/2007 | Yamamoto et al. | |
| 2016/0141737 A1* | 5/2016 | Kubota | H01M 10/0486 429/120 |

FOREIGN PATENT DOCUMENTS

| | | | | |
|---|---|---|---|---|
| CN | 104471784 A | * | 3/2015 | ........ H01M 10/613 |
| CN | 106299543 A | * | 1/2017 | ........ H01M 10/486 |
| CN | 111200173 A | * | 5/2020 | ....... H01M 2220/20 |
| JP | 2011049137 A | * | 3/2011 | ........... Y02E 60/10 |
| JP | 2011171029 A | * | 9/2011 | ........ H01M 10/613 |
| KR | 2015037335 A | * | 4/2015 | ........ H01M 10/613 |

OTHER PUBLICATIONS

Feng et al., "A Novel Ultra-Large Flat Plate Heat Pipe Manufactured by Thermal Spray" Applied Thermal Engineering, vol. 171, May 17, 2020, abstract, 2 pages.

* cited by examiner

BATTERY THERMAL MANAGEMENT WITH LARGE AREA PLANAR HEAT PIPES

TECHNICAL FIELD

Embodiments relate generally to a thermal management system to cool one or more battery packs of a battery.

BACKGROUND

Battery systems that include one or more battery packs, each having one or more batteries, generate heat during operation. Because overall battery performance is adversely impacted by overheating and non-uniform temperature distribution within the battery pack, a thermal management system is provided. Traditional thermal management systems may include, for example, air cooling, liquid cooling, phase change cooling, fan cooling, and fin cooling.

An example of a thermal management system is a heat pipe, which may be employed to maintain appropriate temperatures within the battery system. A heat pipe is a heat transfer device generally including a sealed housing with an inner lining of a wick-like capillary material and a small amount of working fluid in a partial vacuum. Conventional heat pipe structures are generally tubular in cross-section, and includes evaporator and condenser sections regions. Heat is absorbed at the evaporator section by vaporization of the working fluid and is released at the condenser section by condensation of the vapor.

BRIEF SUMMARY

Embodiments relate to a thermal management system to cool a battery system that includes one or more battery packs. The thermal management system in accordance with one or more embodiments is configured to yield uniform temperature distribution within one or more battery packs by reducing the temperature gradient ($\Delta T$) across each battery pack while also maintaining operation of the battery packs within a desired optimum temperature range. In this way, the thermal management system facilitates enhanced battery performance and increased battery operational life.

In accordance with one or more embodiments, a battery system, may comprise: one or more battery packs; a thermal management system to cool the one or more battery packs, the thermal management system including: a heat pipe arrangement that includes a plurality of heat pipes, having a planar configuration, in thermal contact with the one or more battery packs to draw heat therefrom; and a heat sink arrangement that includes a plurality of heat sinks, in thermal contact with two or more edges of the heat pipe arrangement, to dissipate heat away from the heat pipe arrangement.

In accordance with one or more embodiments, a thermal management system to cool one or more battery packs of a battery system may comprise: a heat pipe arrangement that includes a plurality of heat pipes, having a planar configuration, in thermal contact with the one or more battery packs to draw heat therefrom; and a heat sink arrangement that includes a plurality of heat sinks, in thermal contact with two or more edges of the heat pipe arrangement, to dissipate heat away from the heat pipe arrangement.

In accordance with one or more embodiments, a method of cooling one or more battery packs of a battery system may comprise: placing a heat pipe arrangement that includes a plurality of heat pipes having a planar configuration in thermal contact with the one or more battery packs to draw heat therefrom; and placing a heat sink arrangement that includes a plurality of heat sinks in thermal contact with two or more edges of the heat pipe arrangement, to dissipate heat away from the heat pipe arrangement.

In accordance with one or more embodiments, a motor vehicle may comprise: a motor to provide propulsion for the vehicle; a battery system to serve as a power source for the motor, the battery system including one or more battery packs; a thermal management system to cool the one or more battery packs, the thermal management system including: a heat pipe arrangement that includes a plurality of heat pipes, having a planar configuration, in thermal contact with the one or more battery packs to draw heat therefrom; and a heat sink arrangement that includes a plurality of heat sinks, in thermal contact with two or more edges of the heat pipe arrangement, to dissipate heat away from the heat pipe arrangement.

In accordance with one or more embodiments, the heat pipe arrangement comprises: one or more first heat pipes in thermal contact with the one or more battery packs at a first thermal contact region; and one or more second heat pipes in thermal contact with the one or more battery packs at a second thermal contact region opposite to the first thermal contact region.

In accordance with one or more embodiments, the heat sink arrangement comprises one or more first liquid cold plates in thermal contact with the one or more first heat pipes at a third thermal contact region.

In accordance with one or more embodiments, the heat sink arrangement comprises one or more second liquid cold plates in thermal contact with the one or more first heat pipes at a fourth thermal contact region.

In accordance with one or more embodiments, the heat sink arrangement comprises one or more third liquid cold plates in thermal contact with the one or more first heat pipes at a fifth thermal contact region opposite to the third thermal contact region.

In accordance with one or more embodiments, the heat sink arrangement comprises one or more fourth liquid cold plates in thermal contact with the one or more first heat pipes at a sixth thermal contact region opposite to the fourth thermal contact region.

In accordance with one or more embodiments, the one or more third liquid cold plates have a greater cooling performance than the one or more first cold plates.

In accordance with one or more embodiments, the one or more fourth liquid cold plates have a greater cooling performance than the one or more second cold plates.

In accordance with one or more embodiments, the heat sink arrangement comprises one or more fifth liquid cold plates in thermal contact with the one or more second heat pipes at a seventh thermal contact region.

In accordance with one or more embodiments, the heat sink arrangement comprises one or more sixth liquid cold plates in thermal contact with the one or more second heat pipes at an eighth thermal contact region.

In accordance with one or more embodiments, the heat sink arrangement comprises one or more seventh liquid cold plates in thermal contact with the one or more second heat pipes at a ninth thermal contact region opposite to the seventh thermal contact region.

In accordance with one or more embodiments, the heat sink arrangement comprises one or more eight liquid cold plates in thermal contact with the one or more second heat pipes at a tenth thermal contact region opposite to the eighth thermal contact region.
}

In accordance with one or more embodiments, the one or more fifth liquid cold plates have a greater cooling performance than the one or more first seventh plates.

In accordance with one or more embodiments, the one or more sixth liquid cold plates have a greater cooling performance than the one or more eight cold plates.

BRIEF DESCRIPTION OF THE SEVERAL VIEWS OF THE DRAWINGS

The various advantages of the embodiments of the present invention will become apparent to one skilled in the art by reading the following specification and appended claims, and by referencing the following drawings, in which:

DETAILED DESCRIPTION

Figure 1:
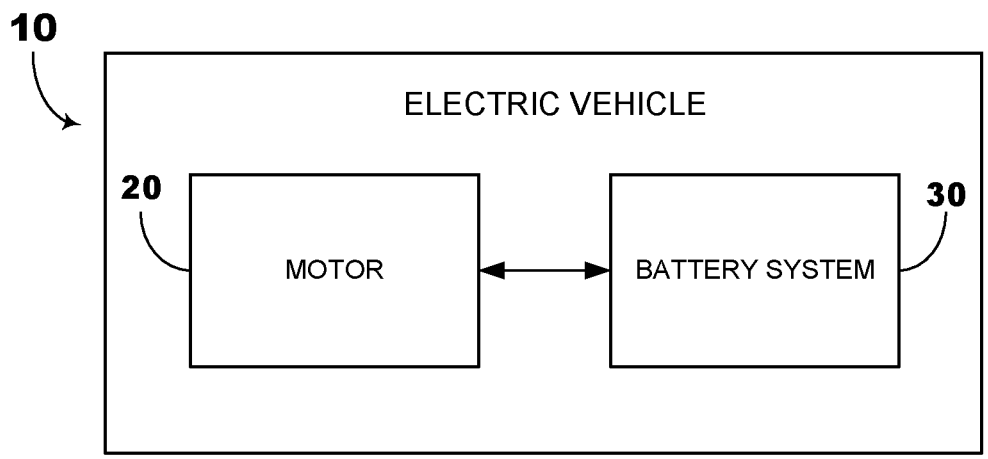
FIG. 1 is diagram of an electric vehicle, in accordance with one or more embodiments.

FIG. 1 illustrates an example of an electric vehicle 10 that comprises a motor 20 for propulsion of the vehicle 10, and a battery system 30 to serve as a power source for the motor 20.

Figure 2:
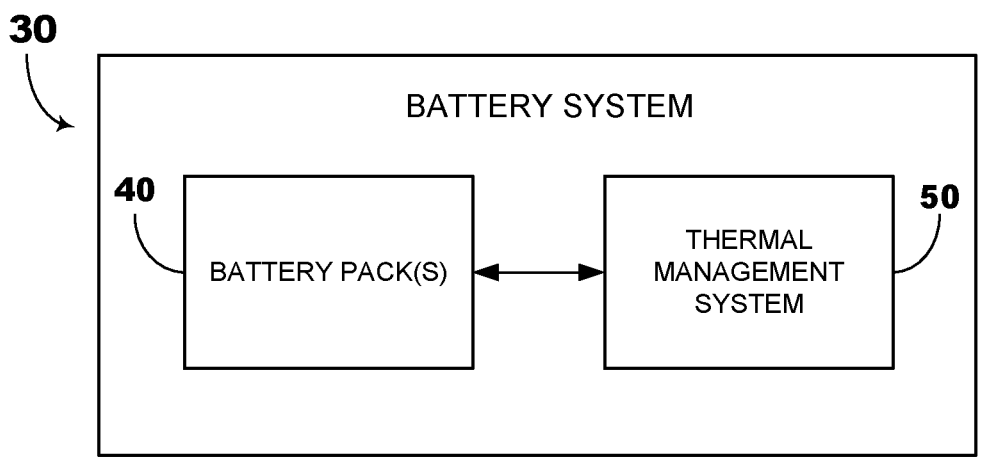
FIG. 2 is diagram of a battery system for the electric vehicle of FIG. 1, in accordance with one or more embodiments.

As illustrated in FIG. 2, the battery system 30 may comprise one or more battery packs 40 that are in thermal contact/thermally coupled to a thermal management system 50 to yield uniform temperature distribution within the battery pack(s) 40 in a manner which reduces the temperature gradient ($\Delta T$) across each battery pack 40 while also maintaining operation of the battery pack(s) 40 within a desired optimum temperature range.

The battery system 30, in accordance with one or more embodiments, may have application in a vehicle 10 such as, for example, an electric vehicle (EV), to include airborne electric vehicles, seaborne electric vehicles, electrically-powered spacecraft, and ground vehicles (e.g., hybrid electric vehicles (HEV), plug-in hybrid electric vehicles (PHEV), battery electric vehicles (BEV), fuel cell electric vehicles (FCEV), and railborne electric vehicles (REV)). Although the battery system 30 and the thermal management system 50 in accordance with embodiments may be implemented for mobility applications such as vehicles, embodiments are not limited thereto, and thus, may be implemented in non-mobility or stationary applications.

Figure 3:
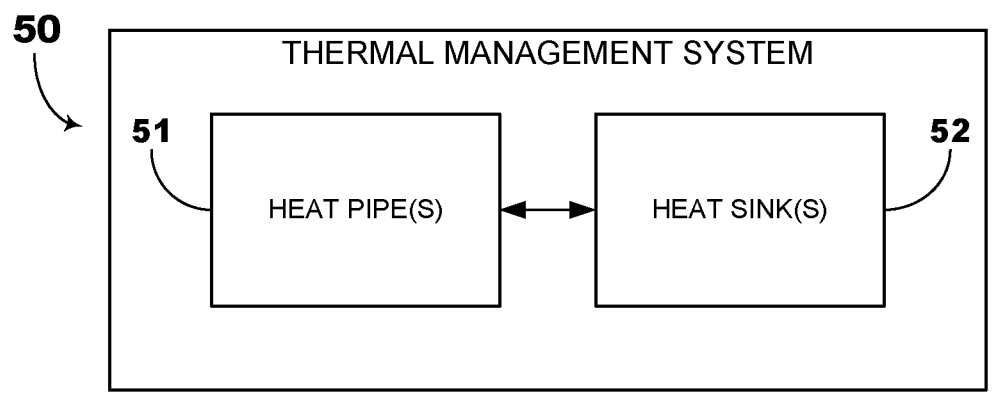
FIG. 3 is diagram of a thermal management system for the battery system of FIG. 2.

As illustrated in FIG. 3, an example of a thermal management system 50 may comprise a heat pipe arrangement that includes one or more heat pipes 51 that are in thermal contact with the battery packs(s) 40 to passively cool the battery pack(s) 40 by drawing heat therefrom during operation, and a heat sink arrangement that includes one or more heat sinks 52 in thermal contact with the heat pipes 51 to passively dissipate heat away from the heat pipes 51.

Figure 4:
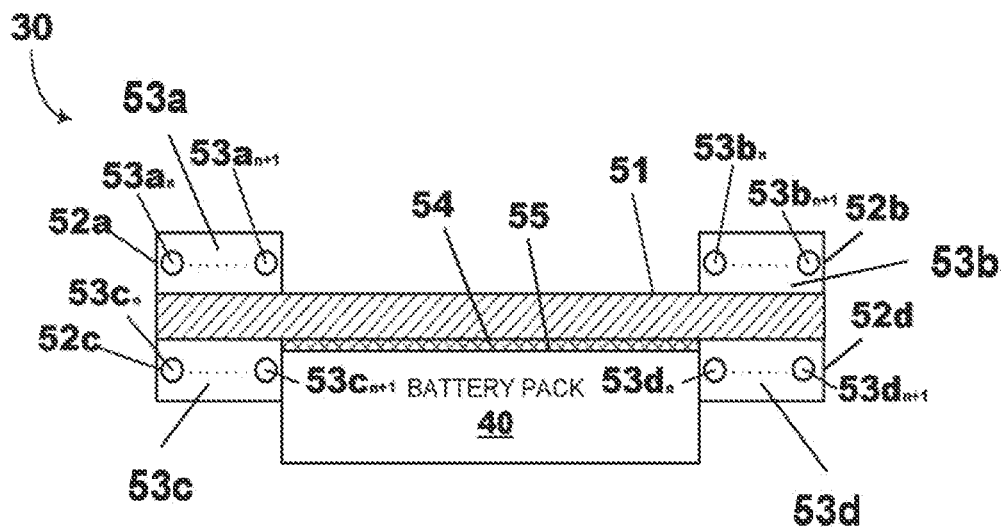
FIG. 4 illustrates a side cross-sectional view of a battery system, in accordance with one or more embodiments.

An example of an embodiment of a battery system 30 is illustrated in FIG. 4, in which the thermal management system 50 is applied to one planar surface of a battery pack 40 to provide cooling thereof. In particular, the illustrated example includes one or more heat pipes 51 in thermal contact, at a planar surface thereof, with the battery pack 40. One or more heat sinks $52a$-$52d$ are in thermal contact with the one or more one or more heat pipes 51.

Figure 5:
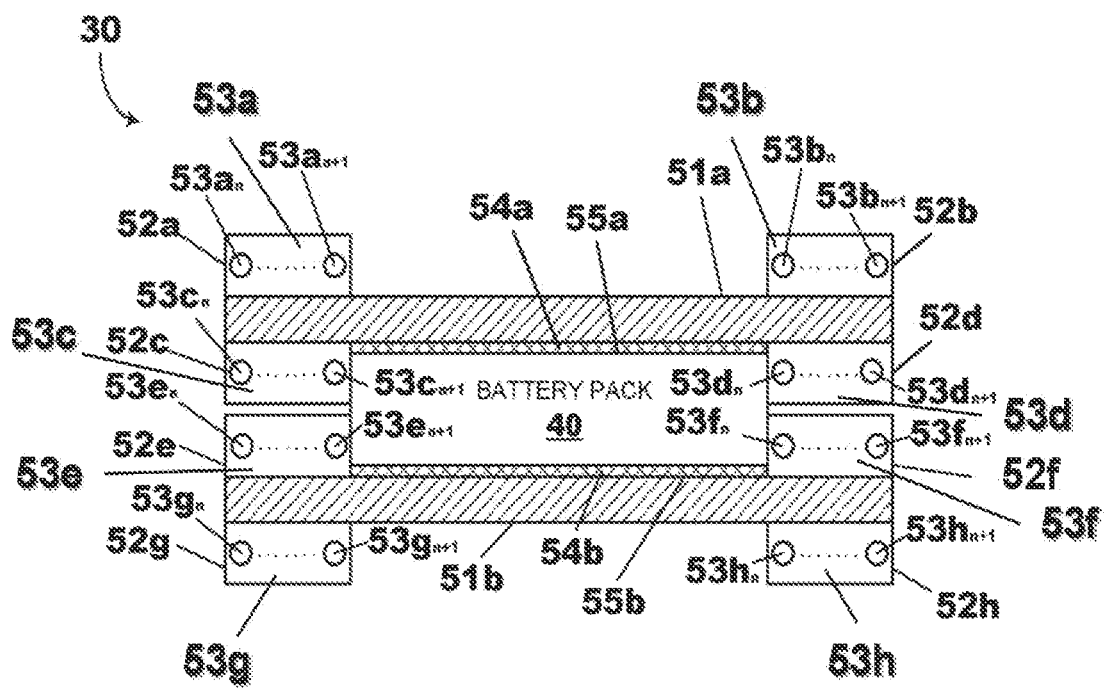
FIG. 5 illustrates a side cross-sectional view of a battery system, in accordance with one or more embodiments.

Another example of an embodiment of a battery system 30 is illustrated in FIG. 5, in which the thermal management system 50 is applied to opposite planar surfaces of the battery pack 40 to provide cooling at two sides thereof. In particular, the illustrated example includes one or more one or more heat pipes $51a$, $51b$ in thermal contact, at respective planar surfaces thereof, with the battery pack 40. One or more heat sinks $52a$-$52h$ are in thermal contact with the one or more one or more heat pipes $51a$, $51b$. The size of the battery, e.g., the height or thickness, is generally dictated by performance of the cooling solution. The illustrated thermal management system 50 of FIG. 5 not only impacts battery performance in providing uniform cooling at both sides of the battery pack 40, but also does not limit the physical size of the battery pack 40. In particular, in contrast to use of single sided battery cooling, which limit the physical size of the battery, the illustrated thermal management system 50 of FIG. 5 may permit use of batteries of greater size and/or capacity.

Figure 6:
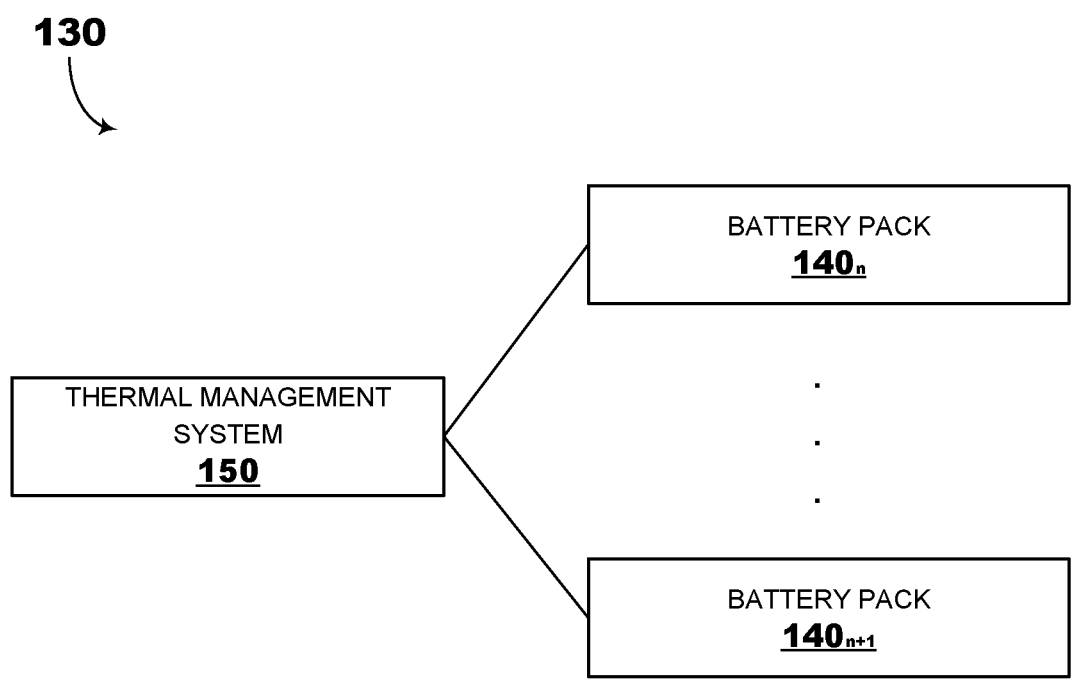
FIG. 6 illustrates a schematic of a battery system, in accordance with one or more embodiments.

Although the illustrated examples of FIGS. 4 and 5 respectively include one battery pack 40, embodiments are not limited thereto, and thus, as illustrated in FIG. 6, may encompass a battery system 130 having two or more battery packs $140_n$, $140_{n+1}$ arranged in a stacked formation. In accordance with one or more embodiments, the battery packs $140_n$, $140_{n+1}$ may be arranged or oriented in a vertical stack formation or alternatively, in a horizontal stack formation. The stack may be cooled via a thermal management system 150 having the same technical features and structure as those of the thermal management system 50 of FIGS. 4 and 5. The thermal management system 50 in accordance with embodiments permits stacking of battery packs 40 in a way that reduces heat transfer distance by at least one-half.

Figure 7:
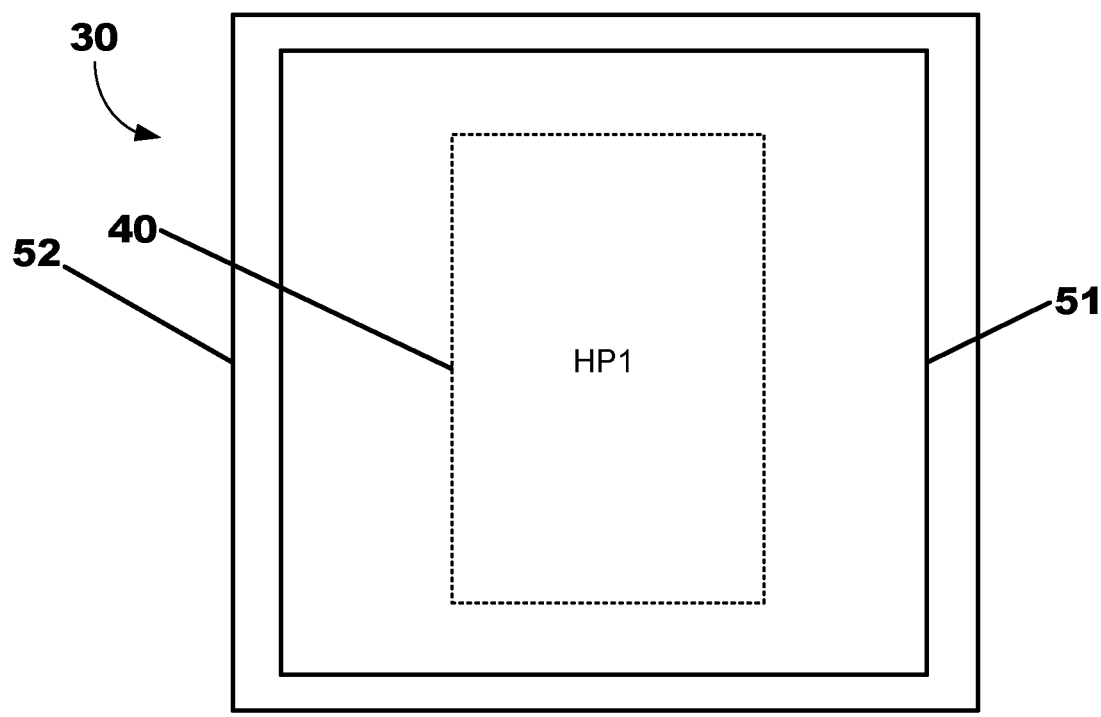
FIG. 7 illustrates a top view of an example of a battery system, in accordance with one or more embodiments.

As illustrated in FIG. 7, an example battery system 30 in accordance with one or more embodiments may comprise one or more battery packs 40 that are in thermal contact/thermally coupled to a thermal management system that includes one or more heat pipes 51 and one or more heat sinks 52 arranged in physical and thermal contact at exposed edge regions (i.e., planar surfaces, and peripheral/perimeter side faces) of the heat pipe(s) 51 to provide localized cooling thereto. In the illustrated example, the heat pipe(s) 51 may respectively comprise a single large area heat pipe HP1 having a planar geometric configuration. The single large area heat pipe HP1 may have a predetermined overall surface area that is greater than the overall surface area of the corresponding battery pack 40. Meaning, the single large area heat pipe HP1 extends beyond the size of the battery 140. In that way, the heat sinks 52 are strategically positioned at a region (i.e., the edge of the heat pipe(s) 51)) of the heat pipe(s) 51 where heat transfer occurs. In accordance with one or more embodiments, the predetermined overall surface area of the single large area heat pipe HP1 may be in a range of about 20 cm×10 cm to 200 cm×100 cm.

Figure 8:
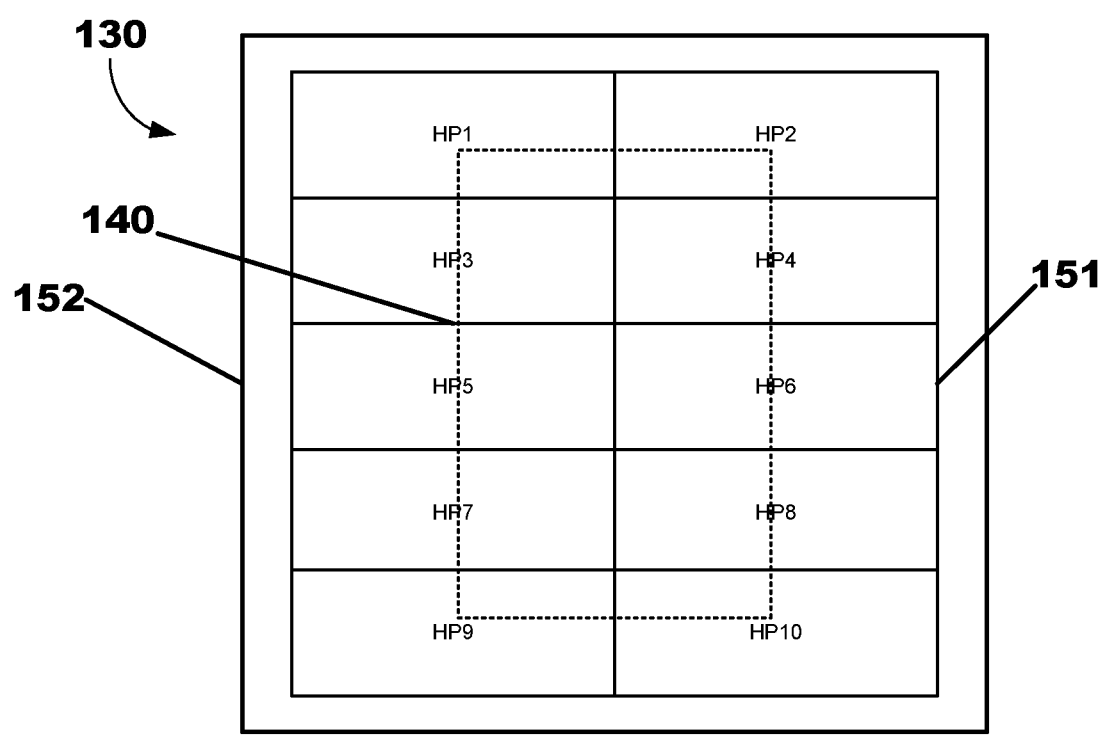
FIG. 8 illustrates a top view of an example of a battery system, in accordance with one or more embodiments.

As illustrated in FIG. 8, alternatively, an example battery system 130 in accordance with one or more embodiments may comprise a battery pack 140 that is in thermal contact/ thermally coupled to a thermal management system that includes one or more heat pipes 151 and one or more heat sinks 152 arranged in physical and thermal contact at exposed edge regions (i.e., planar surfaces, and peripheral/perimeter side faces) of the heat pipe(s) 151 to provide localized cooling thereto. In the illustrated example, the heat pipes 151 may respectively comprise a heat pipe array comprised of a plurality of large area heat pipes HP1-HP10 having planar geometric configurations. The large area heat pipes HP1-HP10 may have a predetermined combined overall surface area that is greater than the overall surface area of the battery pack 140. Meaning, the array of large area heat pipes HP1-HP10 extends beyond the size of the battery 140. In that way, the heat sinks 152 are strategically positioned at a region (i.e., the edge of the heat pipe(s) 151)) of the heat pipe(s) 151 where heat transfer occurs. In accordance with one or more embodiments, the predetermined combined overall surface area of heat pipes HP1-HP10 may be in a range of about 20 cm×10 cm to 200 cm×100 cm.

Although the illustrated an example battery system 130 illustrates ten large area heat pipes HP1-HP10, embodiments are not limited, and thus, may include any number of heat pipes that fall within the spirit and scope of the principles of this disclosure set forth herein. Ultimately, the selection of the overall number of heat pipes per battery pack can take into consideration one or more design variables, including, but not limited to, costs, performance requirements, manufacturing requirements, etc.

The temperature distribution at the surface of the corresponding battery is more uniform when using a single large area planar heat pipe configuration HP1 when compared to use of a plurality of large area planar heat pipes HP1-HP10. This is due to heat resistance between heat pipes HP1-HP10 prevent heat spreading in lateral directions between heat pipes HP1-HP10.

On a matter of scale, the overall surface area of the heat pipe (H1 or HP1-HP10) far exceeds the overall surface area of conventional heat pipes, and thus, provides enhanced overall cooling of the corresponding battery pack 40, 140. In particular, use of large area planar heat pipes 51, 151 having such an overall surface area yields a larger contact interface with the heat source (i.e., the battery pack(s)) 40, 140 when compared to use of tubular heat pipes. Moreover, due to the two-phase heat transfer nature, battery cooling via one or more large area planar heat pipes, when compared to use of tubular heat pipes, may yield enhanced temperature regulation of the battery pack 40 by yielding greater uniform temperature distribution within the battery pack 40 by reducing the temperature gradient ($\Delta T$) across the battery pack 40 while also maintaining operation of the battery pack 40 within a desired optimum temperature range. Moreover, providing a thermal management system that sandwiches both planar sides of the battery pack(s) 40, 140 provides greater battery design flexibility in not restricting the size of the battery pack(s).

As further illustrated in FIG. 4, one or more heat pipes 51 are configured to be in thermal contact with an outer planar surface of the battery pack 40 at a thermal contact region or interface 54 to draw heat generated by the battery pack 40 during operation. A thermal interface material (TIM) 55 may be applied to fill micro-spaces or micro-gaps between the battery pack 40 and the heat pipe(s) 51 at the thermal contact region 54, thereby enhancing heat transfer between the battery pack 40 and the heat pipe(s) 51. In accordance with one or more embodiments, the TIM 55 may comprise a ceramic, graphite, or boron nitride (BN) filled polymer matrix (e.g., alumina, graphite filled silicone), and may take the form of a gap pad or a filler. Embodiments, however, are not limited thereto, and thus, the TIM 55 may be composed of other materials that fall within the spirit and scope of the principles of this disclosure set forth herein.

In accordance with one or more embodiments, the heat sink arrangement 52 may comprise one or more heat sinks 52a-52d in physical and thermal contact with two or more exposed edge regions (i.e., planar surfaces, and peripheral/perimeter side faces) of the heat pipe(s) 51 to provide localized cooling thereto by transferring heat from the heat pipe(s) 51 to a liquid coolant, where it is dissipated from the heat sinks 52a-52d. As used herein, i.e., an edge region of a heat pipe is to mean one that is exposed by not being in physical contact with the battery pack. As used herein, the "sides" at the edge region of the heat pipe(s) 51 extend along a plane that is substantially perpendicular to the upper and the lower planar surfaces of the heat pipe(s) 51. In the illustrated embodiment, the side edge regions respectively extend generally along a horizontal plane, whereas the upper edge region and the lower edge region respectively extend generally along a vertical plane. Providing coverage at all four edge regions (e.g., upper, lower, and sides) of the heat pipe(s) 51 may yield even greater localized cooling. A TIM (not illustrated) may be applied to fill micro-spaces or micro-gaps between the one or more heat pipes 51 and the one or more heat sinks 52a-52d at respective thermal contact regions, thereby enhancing heat transfer therebetween.

In the illustrated embodiment of FIG. 4, a pair of heat sinks 52a, 52b are arranged spaced apart and generally coplanar on an outer planar surface of the heat pipe(s) 51, while another pair of heat sinks 52c, 52d are arranged spaced apart and generally coplanar on an opposing outer planar surface of the heat pipe(s) 51. The heat sinks 52a-52d may respectively comprise a liquid cold plate 53a-53d that includes a cold plate body having one or more internal flow channels 53an-53dn, 53an+1-53dn+1 extending therethrough to facilitate flow of a liquid coolant that is to dissipate heat from the cold plate body. Each internal flow channel 53an-53dn, 53an+1-53dn+1 may include a channel inlet through which the liquid coolant enters the cold plate body, and a channel outlet through which the liquid coolant exits from the cold plate body. Each internal flow channel 53an-53dn, 53an+1-53dn+1 may be sized to have a diameter that falls within the spirit and scope of the principles of this disclosure set forth herein. Although embodiments illustrate internal flow channels having a generally circular configuration, the one or more embodiments disclosed herein are not limited thereto, and thus, may include internal flow channels having any geometric configuration that fall within the spirit and scope of the principles of this disclosure set forth herein.

The operational temperature profiles of the heat pipe arrangement reveal that respective regions of the heat pipe(s) 51 located in the interior of the battery system 30 may be subjected to greater heat exposure than exterior regions. Accordingly, those heat sinks located in a region that is subjected to greater heat exposure may have a structural design to achieve greater cooling performance. As an example, to obtain such greater cooling performance, such heat sinks may have an overall size or an overall surface area that is greater than the respective overall sizes and overall surface areas of heat sinks that are not located in a region that is subjected to greater heat exposure. Additionally or alternatively, to obtain such greater cooling performance by permitting a greater volumetric capacity of liquid coolant, such heat sinks may accommodate a greater overall number of internal flow channels than those heat sinks that are not located in a region that is subjected to greater heat exposure. Additionally or alternatively, to obtain such greater cooling performance by permitting a greater volumetric capacity of liquid coolant, such heat sinks may have internal flow channels of a greater diameter than those heat sinks that are not located in a region that is subjected to greater heat exposure.

As further illustrated in FIG. 5, one or more heat pipes 51a are configured to be in thermal contact with an outer planar surface of the battery pack 40 at a first thermal contact region or interface 54a to draw heat generated by the battery pack 40 during operation. A first thermal interface material (TIM) 55a may be applied to fill micro-spaces or micro-gaps between the battery pack 40 and the heat pipe(s) 51a at the first thermal contact region 54a, thereby enhancing heat transfer between the battery pack 40 and the heat pipe(s) 51a. In accordance with one or more embodiments, the first TIM 55a may comprise a ceramic, graphite, or boron nitride (BN) filled polymer matrix (e.g., alumina, graphite filled silicone), and may take the form of a gap pad or a filler. Embodiments, however, are not limited thereto, and thus, the first TIM 55a may be composed of other materials that fall within the spirit and scope of the principles of this disclosure set forth herein.

Moreover, one or more heat pipes 51b are configured to be in thermal contact with an opposing outer planar surface of the battery pack 40 at a second thermal contact region or interface 54b to draw heat generated by the battery pack 40 during operation. A second TIM 55b may be applied to fill micro-spaces or micro-gaps between the battery pack 40 and the heat pipe(s) 51b at the second thermal contact region 54b, thereby enhancing heat transfer between the battery pack 40 and the heat pipe(s) 51b. In accordance with one or more embodiments, the second TIM 55b may comprise a ceramic, graphite, or boron nitride (BN) filled polymer matrix (e.g., alumina, graphite filled silicone), and may take the form of a gap pad or a filler. Embodiments, however, are not limited thereto, and thus, the second TIM 55b may be composed of other materials that fall within the spirit and scope of the principles of this disclosure set forth herein.

In accordance with one or more embodiments, the heat sink arrangement 52 may comprise a first heat sink group that includes one or more heat sinks 52a-52d in physical and thermal contact with two or more exposed edge regions (i.e., planar surfaces, and peripheral/perimeter side faces) of the heat pipe(s) 51a to provide localized cooling thereto by transferring heat from the heat pipe(s) 51a to a liquid coolant, where it is dissipated from the heat sinks 52a-52d. As used herein, i.e., an edge region of a heat pipe is to mean one that is exposed by not being in physical contact with the battery pack. As used herein, the "sides" at the edge region of the heat pipe(s) 51a extend along a plane that is substantially perpendicular to the upper and the lower planar surfaces of the heat pipe(s) 51a. In the illustrated embodiment, the side edge regions respectively extend generally along a horizontal plane, whereas the upper edge region and the lower edge region respectively extend generally along a vertical plane. Providing coverage at all four edge regions (e.g., upper, lower, and sides) of the heat pipe(s) 51a may yield even greater localized cooling. A thermal interface material (TIM) (not illustrated) may be applied to fill micro-spaces or micro-gaps between the one or more heat pipes 51a and the one or more heat sinks 52a-52d at respective thermal contact regions, thereby enhancing heat transfer therebetween.

In the illustrated embodiment of FIG. 5, a pair of heat sinks 52a, 52b are arranged spaced apart and coplanar on an outer planar surface of the heat pipe(s) 51a, while another pair of heat sinks 52c, 52d are arranged spaced apart and coplanar on an opposing outer planar surface of the heat pipe(s) 51a. The heat sinks 52a-52d may respectively comprise a liquid cold plate 53a-53d that includes a cold plate body having one or more internal flow channels 53an-53dn, 53an+1-53dn+1 extending therethrough to facilitate flow of a liquid coolant that is to dissipate heat from the cold plate body. Each internal flow channel 53an-53dn, 53an+1-53dn+1 may include a channel inlet through which the liquid coolant enters the cold plate body, and a channel outlet through which the liquid coolant exits from the cold plate body. Each internal flow channel 53an-53dn, 53an+1-53dn+1 may be sized to have a diameter that falls within the spirit and scope of the principles of this disclosure set forth herein.

In accordance with one or more embodiments, the heat sink arrangement 52 may further comprise one or more heat sinks 52e-52h in physical and thermal contact with two or more edge regions (i.e., planar surfaces, and peripheral/perimeter side faces) of the heat pipe(s) 51a to provide localized cooling thereto by transferring heat from the heat pipe(s) 51a to a liquid coolant, where it is dissipated from the heat sinks 52e-52e. A thermal interface material (TIM) (not illustrated) may be applied to fill micro-spaces or micro-gaps between the one or more intermediate heat pipes 51b and the one or more second heat sinks 52e-52h at a thermal contact region, thereby enhancing heat transfer therebetween.

In the illustrated embodiment, a pair of heat sinks 52e, 52f are arranged spaced apart and coplanar on an outer planar surface of the heat pipe(s) 51b, while another pair of second heat sinks 52g, 52h are arranged spaced apart and coplanar on an opposing outer planar surface of the heat pipe(s) 51b. The heat sinks 52e-52h may respectively comprise a liquid cold plate 53e-53h that includes a cold plate body having a plurality of internal flow channels 53en-53hn, 53en+1-53hn+1 extending therethrough to facilitate flow of a liquid coolant that is to dissipate heat from the cold plate body. Each internal flow channel 53en-53hn, 53en+1-53hn+1 may include a channel inlet through which the liquid coolant enters the cold plate body, and a channel outlet through which the liquid coolant exits from the cold plate body. Each internal flow channel 53en-53hn, 53en+1-53hn+1 may be sized to have a diameter that falls within the spirit and scope of the principles of this disclosure set forth herein.

The operational temperature profiles of the heat pipe arrangement reveal that respective regions of the heat pipe(s) 51a and the heat pipe(s) 51b located in the interior of the battery system 30 are subjected to greater heat exposure than exterior regions. Accordingly, heat sinks 52c-52f may have a structural design to achieve greater cooling performance than the heat sinks 52a, 52b, 52g, 52h. As an example, to obtain such greater cooling performance, the heat sinks 52c-52f may have an overall size or an overall surface area that is greater than the respective overall sizes and overall surface areas of the heat sinks 52a, 52b, 52g, 52h. Additionally or alternatively, to obtain such greater cooling performance, the heat sinks 52c-52f may accommodate a greater overall number of internal flow channels than those of the heat sinks 52a, 52b, 52g, 52h in order to permit a greater volumetric capacity for the liquid coolant. Additionally or alternatively, to obtain such greater cooling performance, the heat sinks 52c-52f may have internal flow channels of a greater diameter than those of the heat sinks 52a, 52b, 52g, 52h in order to permit a greater volumetric capacity for the liquid coolant.

In accordance with one or more embodiments, each cold plate body may be composed of a metal or metal composite exhibiting high thermal conductivity. As an example, such a metal or metal composite may comprise aluminum, copper, or stainless. The liquid coolant may comprise a high thermally conductive fluid that is thermally stable, and compatible with the material composition of the respective heat sink through which it flows.

Figure 9:
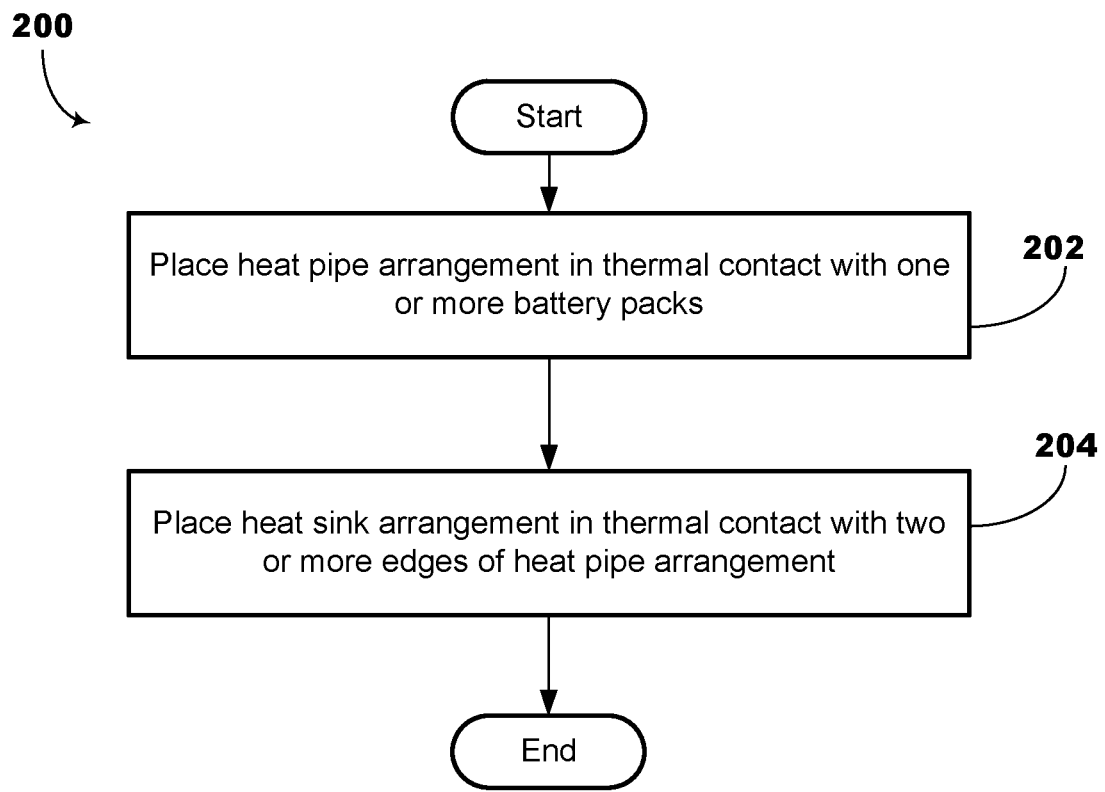
FIG. 9 is a flowchart of a method of cooling a battery system, in accordance with one or more embodiments.

As illustrated in FIG. 9, a method 200 for cooling one or more battery packs of a battery system is provided. The method 200 may be implemented, for example, in logic instructions (e.g., software), configurable logic, fixed-functionality hardware logic, etc., or any combination thereof.

Block 202 includes placing a heat pipe arrangement, one that may include, for example, one or more heat pipes having a planar configuration, in thermal contact with outer planar surfaces of one or more battery packs of the battery system to draw heat therefrom.

In accordance with one or more embodiments of the method 100, the heat pipe arrangement comprises one or more first heat pipes in thermal contact with the one or more battery packs at a first thermal contact region, and one or more second heat pipes in thermal contact with the one or more battery packs at a second thermal contact region opposite to the first thermal contact region.

Block 204 includes placing a heat sink arrangement, one that may include, for example, one or more heat sinks, in thermal contact with two or more edges of the heat pipe arrangement, to dissipate heat away from the heat pipe arrangement. Performance of block 204 may be conducted simultaneously, in series, or in parallel with the performance of block 202.

In accordance with one or more embodiments of the method 200, the heat sink arrangement comprises one or more first liquid cold plates in thermal contact with the one or more first heat pipes at a third thermal contact region, and one or more second liquid cold plates in thermal contact with the one or more first heat pipes at a fourth thermal contact region.

In accordance with one or more embodiments of the method 200, the heat sink arrangement comprises one or more third liquid cold plates in thermal contact with the one or more first heat pipes at a fifth thermal contact region opposite to the third thermal contact region, and one or more fourth liquid cold plates in thermal contact with the one or more first heat pipes at a sixth thermal contact region opposite to the fourth thermal contact region.

In accordance with one or more embodiments of the method 200, the one or more third liquid cold plates may have a greater cooling performance than the one or more first cold plates, and the one or more fourth liquid cold plates may have a greater cooling performance than the one or more second cold plates.

In accordance with one or more embodiments of the method 200, the heat sink arrangement comprises one or more fifth liquid cold plates in thermal contact with the one or more second heat pipes at a seventh thermal contact region, and one or more sixth liquid cold plates in thermal contact with the one or more second heat pipes at an eighth thermal contact region.

In accordance with one or more embodiments of the method 200, the heat sink arrangement comprises one or more seventh liquid cold plates in thermal contact with the one or more second heat pipes at a ninth thermal contact region opposite to the seventh thermal contact region, and one or more eight liquid cold plates in thermal contact with the one or more second heat pipes at a tenth thermal contact region opposite to the eighth thermal contact region.

In accordance with one or more embodiments of the method 200, the one or more fifth liquid cold plates may have a greater cooling performance than the one or more seventh plates, and the one or more sixth liquid cold plates may have a greater cooling performance than the one or more eight cold plates.

The terms "coupled," "attached," or "connected" may be used herein to refer to any type of relationship, direct or indirect, between the components in question, and may apply to electrical, mechanical, fluid, optical, electromagnetic, electromechanical or other connections. In addition, the terms "first," "second," etc. are used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

What is claimed is:

1. A battery system, comprising:
   one or more battery packs; and
   a thermal management system to cool the one or more battery packs, the thermal management system including:
      a heat pipe arrangement that includes a plurality of heat pipes, having a planar configuration, in thermal contact with and between the one or more battery packs to draw heat therefrom, wherein the heat pipe further includes two opposite sides connecting an outer planar surface and an opposing outer planar surface; and
      a heat sink arrangement that includes a plurality of heat sinks that include a liquid in thermal contact with two or more edges of the heat pipe arrangement, to dissipate heat away from the heat pipe arrangement, wherein a first pair of the plurality of heat sinks is arranged spaced apart and coplanar on the outer planar surface of the heat pipe, and a second pair of the plurality of heat sinks is arranged spaced apart, and coplanar on the opposing outer planar surface of the heat pipe, and wherein the heat sink extends along surfaces of the two opposite sides, the outer planar surface, and the opposing outer planar surface.

2. The battery system of claim 1, wherein the heat pipe arrangement comprises:
   one or more first heat pipes in thermal contact with the one or more battery packs at a first thermal contact region; and
   one or more second heat pipes in thermal contact with the one or more battery packs at a second thermal contact region opposite to the first thermal contact region.

3. The battery system of claim 2, wherein the heat sink arrangement comprises:
   one or more first liquid cold plates in thermal contact with the one or more first heat pipes at a third thermal contact region; and
   one or more second liquid cold plates in thermal contact with the one or more first heat pipes at a fourth thermal contact region.

4. The battery system of claim 3, wherein the heat sink arrangement comprises:
one or more third liquid cold plates in thermal contact with the one or more first heat pipes at a fifth thermal contact region opposite to the third thermal contact region; and
one or more fourth liquid cold plates in thermal contact with the one or more first heat pipes at a sixth thermal contact region opposite to the fourth thermal contact region.

5. The battery system of claim 4, wherein:
the one or more third liquid cold plates have a greater cooling performance than the one or more first cold plates, and
the one or more fourth liquid cold plates have a greater cooling performance than the one or more second cold plates.

6. The battery system of claim 2, wherein the heat sink arrangement comprises:
one or more fifth liquid cold plates in thermal contact with the one or more second heat pipes at a seventh thermal contact region; and
one or more sixth liquid cold plates in thermal contact with the one or more second heat pipes at an eighth thermal contact region.

7. The battery system of claim 6, wherein the heat sink arrangement comprises:
one or more seventh liquid cold plates in thermal contact with the one or more second heat pipes at a ninth thermal contact region opposite to the seventh thermal contact region; and
one or more eight liquid cold plates in thermal contact with the one or more second heat pipes at a tenth thermal contact region opposite to the eighth thermal contact region.

8. The battery system of claim 6, wherein:
the one or more fifth liquid cold plates have a greater cooling performance than the one or more first seventh plates, and
the one or more sixth liquid cold plates have a greater cooling performance than the one or more eight cold plates.

9. The battery system of claim 1, wherein:
the first pair of heat sinks are in contact with a first battery pack; and
the second pair of heat sinks are in contact with a second battery pack.

10. A thermal management system to cool one or more battery packs of a battery system, the thermal management system comprising:
a heat pipe arrangement that includes a plurality of heat pipes, having a planar configuration, in thermal contact with and between the one or more battery packs to draw heat therefrom, wherein the heat pipe further includes two opposite sides connecting an outer planar surface and an opposing outer planar surface; and
a heat sink arrangement that includes a plurality of heat sinks that include a liquid in thermal contact with two or more edges of the heat pipe arrangement, to dissipate heat away from the heat pipe arrangement, wherein a first pair of the plurality of heat sinks is arranged spaced apart and coplanar on the outer planar surface of the heat pipe, and a second pair of the plurality of heat sinks is arranged spaced apart, and coplanar on the opposing outer planar surface of the heat pipe, and wherein the heat sink extends along surfaces of the opposite sides, the outer planar surface, and the opposing outer planar surface.

11. The thermal management system of claim 10, wherein the heat pipe arrangement comprises:
one or more first heat pipes in thermal contact with the one or more battery packs at a first thermal contact region; and
one or more second heat pipes in thermal contact with the one or more battery packs at a second thermal contact region opposite to the first thermal contact region.

12. The thermal management system of claim 11, wherein the heat sink arrangement comprises:
one or more first liquid cold plates in thermal contact with the one or more first heat pipes at a third thermal contact region; and
one or more second liquid cold plates in thermal contact with the one or more first heat pipes at a fourth thermal contact region.

13. The thermal management system of claim 12, wherein the heat sink arrangement comprises:
one or more third liquid cold plates in thermal contact with the one or more first heat pipes at a fifth thermal contact region opposite to the third thermal contact region; and
one or more fourth liquid cold plates in thermal contact with the one or more first heat pipes at a sixth thermal contact region opposite to the fourth thermal contact region.

14. The thermal management system of claim 13, wherein:
the one or more third liquid cold plates have a greater cooling performance than the one or more first cold plates, and
the one or more fourth liquid cold plates have a greater cooling performance than the one or more second cold plates.

15. The thermal management system of claim 11, wherein the heat sink arrangement comprises:
one or more fifth liquid cold plates in thermal contact with the one or more second heat pipes at a seventh thermal contact region; and
one or more sixth liquid cold plates in thermal contact with the one or more second heat pipes at an eighth thermal contact region.

16. The thermal management system of claim 15, wherein the heat sink arrangement comprises:
one or more seventh liquid cold plates in thermal contact with the one or more second heat pipes at a ninth thermal contact region opposite to the seventh thermal contact region; and
one or more eight liquid cold plates in thermal contact with the one or more second heat pipes at a tenth thermal contact region opposite to the eighth thermal contact region.

17. The thermal management system of claim 16, wherein:
the one or more fifth liquid cold plates have a greater cooling performance than the one or more first seventh plates, and
the one or more sixth liquid cold plates have a greater cooling performance than the one or more eight cold plates.

18. The thermal management system of claim 10, wherein:
the first pair of heat sinks are in contact with a first battery pack; and the second pair of heat sinks are in contact with a second battery pack.

19. A method of cooling one or more battery packs of a battery system, the method comprising:
placing a heat pipe arrangement that includes a plurality of heat pipes having a planar configuration in thermal contact with and between the one or more battery packs to draw heat therefrom, wherein the heat pipe further includes two opposite sides connecting an outer planar surface and an opposing outer planar surface; and
placing a heat sink arrangement that includes a plurality of heat sinks that include a liquid in thermal contact with two or more edges of the heat pipe arrangement, to dissipate heat away from the heat pipe arrangement, wherein a first pair of the plurality of heat sinks is arranged spaced apart and coplanar on the outer planar surface of the heat pipe, and a second pair of the plurality of heat sinks is arranged spaced apart, and coplanar on the opposing outer planar surface of the heat pipe, and wherein the heat sink extends along surfaces of the opposite sides, the outer planar surface, and the opposing outer planar surface.

20. The method of claim 19, wherein:
the first pair of heat sinks are in contact with a first battery pack; and
the second pair of heat sinks are in contact with a second battery pack.

* * * * *